(12) United States Patent
Jan

(10) Patent No.: US 7,139,641 B2
(45) Date of Patent: Nov. 21, 2006

(54) WAFER PROTECTION SYSTEM

(75) Inventor: Chin-Tsan Jan, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 199 days.

(21) Appl. No.: 10/402,286

(22) Filed: Mar. 27, 2003

(65) Prior Publication Data

US 2004/0188018 A1    Sep. 30, 2004

(51) Int. Cl.
*G05F 19/00* (2006.01)

(52) U.S. Cl. ............... 700/245; 700/258; 118/697; 118/715; 438/424; 438/681; 219/121.52; 156/345.12

(58) Field of Classification Search ............ 700/245, 700/258; 188/697, 715, 723 R; 438/424, 438/681; 73/866.1; 219/121.52
See application file for complete search history.

(56) References Cited

U.S. PATENT DOCUMENTS

| | | | | |
|---|---|---|---|---|
| 6,063,198 | A * | 5/2000 | Bang et al. | 118/715 |
| 6,114,216 | A * | 9/2000 | Yieh et al. | 438/424 |
| 6,189,482 | B1 * | 2/2001 | Zhao et al. | 118/723 R |
| 6,348,099 | B1 * | 2/2002 | Xia et al. | 118/697 |
| 6,352,591 | B1 * | 3/2002 | Yieh et al. | 118/697 |
| 6,616,767 | B1 * | 9/2003 | Zhao et al. | 219/121.52 |
| 6,645,303 | B1 * | 11/2003 | Frankel et al. | 118/725 |
| 2004/0154417 | A1 * | 8/2004 | Renken et al. | 73/866.1 |
| 2004/0199291 | A1 * | 10/2004 | Freeman et al. | 700/258 |
| 2004/0224505 | A1 * | 11/2004 | Nguyen et al. | 438/681 |

FOREIGN PATENT DOCUMENTS

WO    WO 94/12991    *  9/1994

OTHER PUBLICATIONS

Sudder et al., Selective silicon processing for advanced ultra shallow junction engineering, 2002, IEEE, pp. 91-95.*

* cited by examiner

*Primary Examiner*—Thomas Black
*Assistant Examiner*—McDienuel Marc
(74) *Attorney, Agent, or Firm*—Tung & Associates

(57) ABSTRACT

A system for protecting wafers from damage caused by an inaccurately-positioned wafer transfer robot blade during the transfer of wafers typically from a wafer cassette to a processing tool. The wafer protection system includes a conductor foil which is electrically separated from the robot blade through a space or gap and is connected to a relay circuit that is normally closed to facilitate flow of electrical power to the robot blade motor. Upon initial contact of the robot blade with the edge of a wafer, the conductor foil deforms and contacts the blade through the space or gap, completing a circuit between the blade and the relay circuit. The relay circuit opens, thereby terminating further power flow to the robot blade motor and immediately preventing further movement of the robot blade against the wafer.

20 Claims, 2 Drawing Sheets

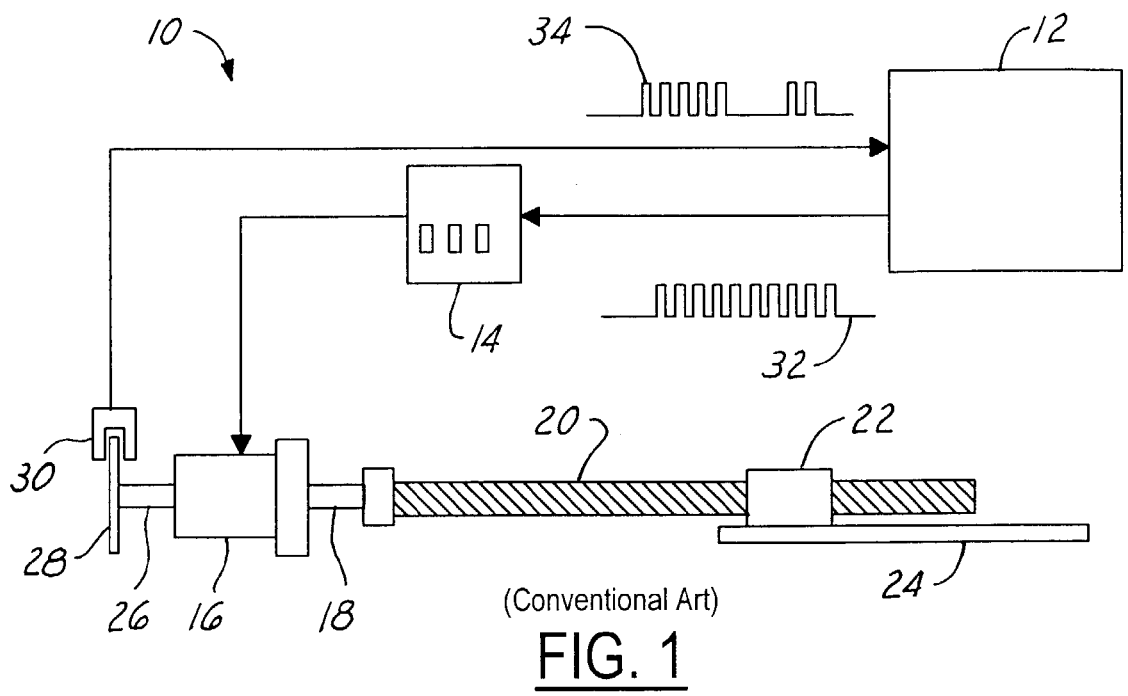
(Conventional Art)
FIG. 1
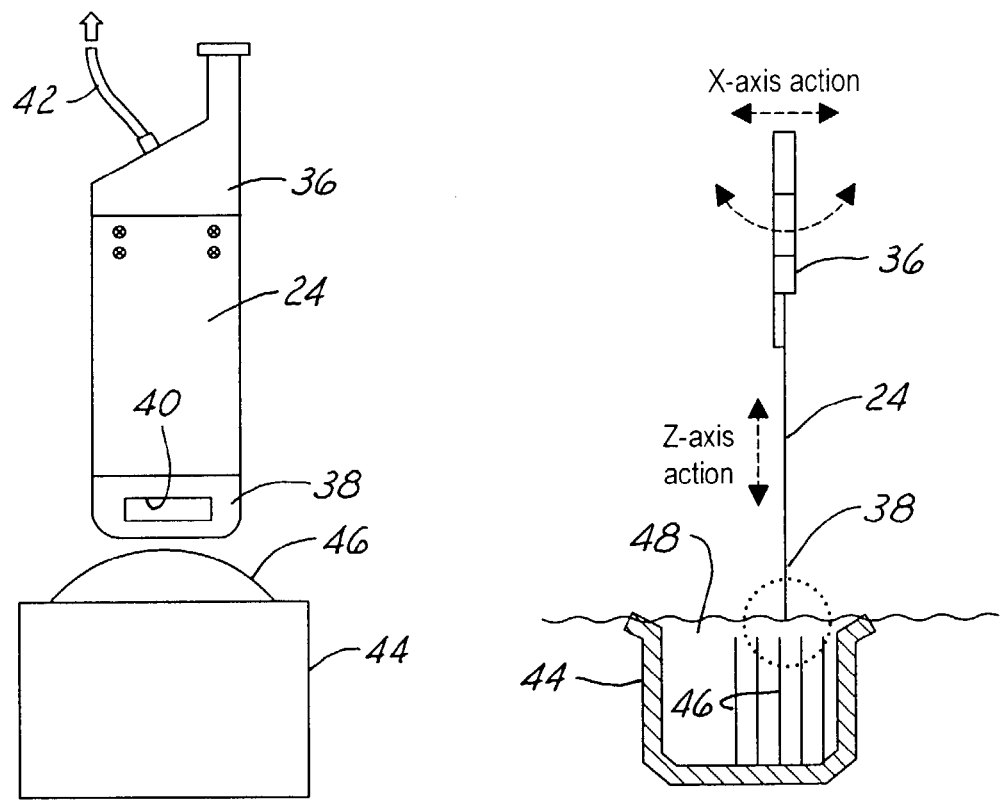
(Conventional Art)
FIG. 2
(Conventional Art)
FIG. 3

WAFER PROTECTION SYSTEM

FIELD OF THE INVENTION

The present invention relates to robots for transferring semiconductor wafer substrates among multiple processing stations in a semiconductor fabrication facility. More particularly, the present invention relates to a system which senses incorrect or potential wafer-damaging contact between a blade of a wafer transfer robot and a wafer in a wafer cassette and automatically terminates further movement of the robot blade to prevent damage to the wafer.

BACKGROUND OF THE INVENTION

In the semiconductor production industry, various processing steps are used to fabricate integrated circuits (ICs) on a semiconductor wafer. These steps include the deposition of layers of different materials including metallization layers, passivation layers and insulation layers on the wafer substrate, as well as photoresist stripping and sidewall passivation polymer layer removal. In modern memory devices, for example, multiple layers of metal conductors are required for providing a multi-layer metal interconnection structure in defining a circuit on the wafer. Typically, multiple alternating layers of electrically conductive and insulative materials are sequentially deposited on the wafer substrate, and conductive layers at different levels on the wafer may be electrically connected to each other by etching vias, or openings, in the insulative layers and filling the vias using aluminum, tungsten or other metal to establish electrical connection between the conductive layers. Chemical vapor deposition (CVD) processes are widely used to form layers of materials on a semiconductor wafer. Other processing steps in the fabrication of the circuits include formation of a photoresist or other mask such as titanium oxide or silicon oxide, in the form of the desired metal interconnection pattern, using standard lithographic techniques; subjecting the wafer substrate to a dry etching process to remove the conducting layer from the areas not covered by the mask, thereby leaving the metal layer in the form of the masked pattern; removing the mask layer using reactive plasma and chlorine gas, thereby exposing the top surface of the metal interconnect layer; cooling and drying the wafer substrate by applying water and nitrogen gas to the wafer substrate; and removing or stripping polymer residues from the wafer substrate.

Throughout the IC fabrication process, the work-in-progress (WIP) wafer substrates must be sequentially transferred among multiple processing stations. The wafer-transfer operation must be carried out under stringent cleanliness conditions and at various pressures. Accordingly, numerous mechanical arrangements have been devised to facilitate transferring wafers from one processing chamber to another or from a transport vehicle such as an automatic guided vehicle (AGV) or an overhead hoist transport (OHT) vehicle.

Typically, multiple semiconductor wafers are loaded into a wafer cassette such that the wafers can be transported and processed in multiple-wafer lots. A cassette loaded with wafers is inserted into an input/output (I/O) chamber, or "load lock" chamber, where a desired gas pressure and atmosphere can be established. The wafers are fed one-by-one to or from their respective cassettes into or out of the load lock chamber. It is desirable from the standpoint of efficiency in handling of the wafers that the loadlock chamber be located in close proximity to a number of processing chambers to permit more than one wafer to be processed nearby and at the same time. To this end, two or more chambers are arranged at locations on the periphery of a transfer chamber which is hermetically sealable and communicates with both the loadlock chamber and the processing chambers. Located within the transfer chamber is an automatically controlled wafer handling mechanism, or robot, which takes wafers from the loadlock chamber and then transfers each wafer into a selected processing chamber. After processing in one chamber, a wafer is withdrawn by the robot and inserted into the next processing chamber in the processing sequence. Ultimately, the wafer is returned to the load lock chamber and into a cassette for transport to the next processing station.

WIP semiconductor wafers are fragile and easily chipped, cracked or scratched. Therefore, the wafers must be handled with great care during processing and transfer. Wafer transfer robots are designed to handle wafers securely and yet without scratching the surface or cracking or chipping an edge of the wafers. The robot transfers each wafer in a smooth motion without vibration or sudden stops or jerks. Vibration of the robot blade could cause abrasion between the blade holding the wafer and the surface of the wafer. This could result in the formation of potential circuit-contaminating particles on the wafer or other wafers to be handled by the robot. As a result, the design of a robot requires careful measures to ensure that the movable parts of the robot operate smoothly without lost motion or play, with the requisite gentleness in holding a wafer, and yet be capable of moving the wafer quickly, smoothly and accurately between two locations.

Referring to FIGS. 1–3, a typical conventional. wafer robot-actuating system 10 includes a control board 12 which is connected to a step motor driver 14 that drives a step motor 16. A lead screw 20 is coupled to the drive shaft 18 of the step motor 16. A blade collar 22, to which is attached a robot blade 24, threadibly engages the lead screw 20. The control board 12 sends a command signal 32 to the step motor driver 14, which actuates the step motor 16 to rotate the motor drive shaft 18 and lead screw 20. Accordingly, depending on the direction of rotation of the lead screw 20 as determined by the control board 12, the robot blade 24 moves in the Z-axis direction toward or away from a wafer 46 preparatory to either picking up the wafer 46 or removing the wafer 46 from a wafer cassette 44, respectively. An encoder disk 28 is provided on an encoder shaft 26 drivingly engaged by the step motor 16. An encoder 30 is provided in magnetic proximity to the encoder disk 28 and provides a feedback signal 34 to the control board 12 indicating the number of revolutions of the encoder disk 28, and thus, the Z-axis position of the robot blade 24.

As shown in FIG. 2, the robot blade 24 typically extends from a blade seat 36 and is fitted with a rubber or plastic gasket 38 having a vacuum opening 40. Vacuum pressure is applied to the vacuum opening 40 through a vacuum tube 42 as the gasket 38 contacts one of the wafers 46 in the cassette 44. The wafer 46 is thus held against the gasket 38 by vacuum pressure as the robot blade 24 lifts the wafer 46 from the cassette 44, which may be submerged in DI water 48 in some chemical mechanical polishing (CMP) applications, for example.

One of the problems commonly encountered in operation of the robot actuating system 10 is that the robot blade 24 has a tendency to strike the edge of one or more of the wafers 46 in the cassette 44 as the blade 24 is lowered into position to lift the wafer 46 from the cassette 44. This causes cracking, chipping and/or abrasion of the wafer 46, resulting in damage to the wafer or the generation of potential circuit-contaminating particles. Conventional blade/wafer collision prevention systems utilize an optical signal which indicates to the control board that the blade is in danger of striking and damaging the wafer or wafers. However, in cases in which the robot blade 24 must be submerged into DI water 48 to pick up the wafer or wafers 46, the optical signal is interrupted or distorted by ripples in the DI water 48. This interferes with the ability of the wafer robot to timely intervene and prevent harmful striking of the robot blade with the wafer. Accordingly, a wafer protection system is needed for preventing a robot blade from striking or pushing against a wafer in a cassette and which is adaptable to wafer transfer robots used to remove wafers from DI water.

An object of the present invention is to provide a new and improved system for preventing damage to a wafer resulting from striking of a robot blade with the wafer.

Another object of the present invention is to provide a wafer protection system which may be adapted to any type of semiconductor processing system.

Yet another object of the present invention is to provide a wafer protection system which senses improper positioning of a wafer transfer robot blade with respect to a wafer and terminates further movement of the blade to prevent blade-induced damage to the wafer.

Still another embodiment of the present invention is to provide a wafer protection system which utilizes electrical contact between a foil conductor and a wafer robot blade to terminate continued movement of the blade and prevent cracking, chipping or abrasion of the wafer.

A still further object of the present invention is to provide a wafer protection system which is applicable to wafer transfer robot blades that are immersed in water or other liquid during the wafer transfer operation.

Another object of the present invention is to provide a wafer protection system which is simple in design and operation.

SUMMARY OF THE INVENTION

In accordance with these and other objects and advantages, the present invention is generally directed to a system for protecting wafers from damage caused by an inaccurately-positioned wafer transfer robot blade during the transfer of wafers typically from a wafer cassette to a processing tool. The wafer protection system includes a conductor foil which is electrically separated from the robot blade through a space or gap and is connected to a relay circuit that is normally closed to facilitate flow of electrical power to the robot blade motor. Upon initial contact of the robot blade with the edge of a wafer, the conductor foil deforms and contacts the blade through the space or gap, completing a circuit between the blade and the relay circuit. The relay circuit opens, thereby terminating further power flow to the robot blade motor and immediately preventing further movement of the robot blade against the wafer.

BRIEF DESCRIPTION OF THE DRAWINGS

The invention will now be described, by way of example, with reference to the accompanying drawings, in which:

FIG. 1 is a schematic diagram of a typical conventional wafer robot actuating system;

FIG. 2 is a front view of a robot blade of a conventional wafer robot preparatory to removing a wafer from a wafer cassette;

FIG. 3 is a side view of the robot blade, wafer cassette and wafer shown in FIG. 2, with the wafer cassette shown in cross-section;

DESCRIPTION OF THE PREFERRED EMBODIMENTS

The present invention is generally directed to a system for protecting a semiconductor wafer from damage in the event that an inaccurately-positioned robot blade of a wafer transfer robot improperly contacts the edge of the wafer during a wafer transfer operation. The system is designed to automatically and immediately stop further movement of the robot blade upon initial contact of the blade with the edge of the wafer. The wafer protection system of the present invention is applicable to a variety of processing systems used in the fabrication of semiconductors, including but not limited to processing systems such as the Mirra chemical mechanical polishing (CMP) system, in which the robot blade must be at least partially submerged in DI water in order to facilitate removal of the wafers from a wafer cassette.

Figure 4:
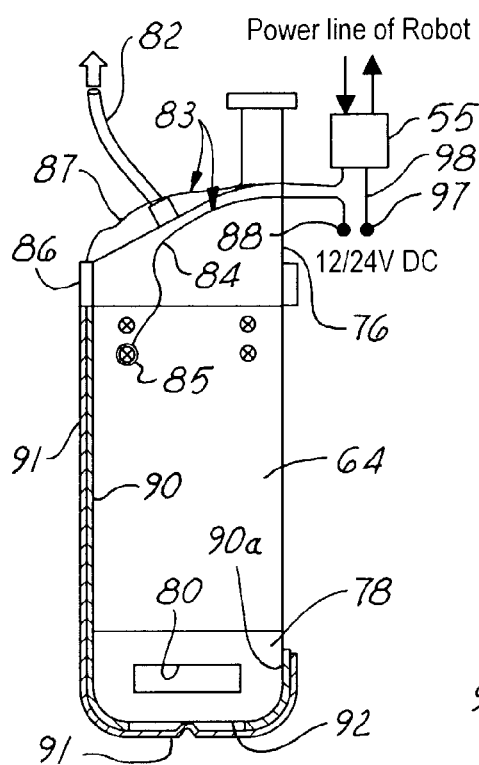
FIG. 4 is a front view of a wafer robot blade in implementation of the present invention, with the conductor foil and foil insulator elements of the invention shown in cross-section.
Figure 6:
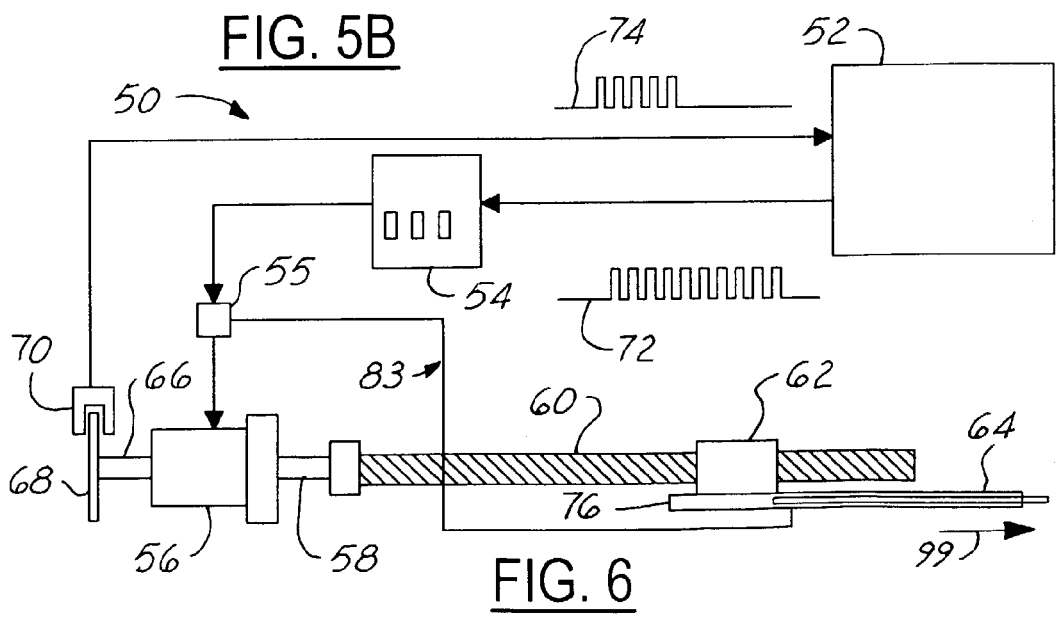
FIG. 6 is a schematic diagram of a wafer robot actuating system in implementation of the present invention.

Referring initially to FIG. 6, a schematic diagram of a robot actuating system 50 in implementation of the present invention is shown. It is understood that the robot actuating system 50 shown in FIG. 6 and hereinafter described is only one example of a robot actuating system which may be used in implementation of the present invention, and that the present invention may be equally well-suited to robot actuating systems of alternative design. The robot actuating system 50 typically includes a control board 52 which is electrically connected to a step motor driver 54 that drives a step motor 56. A relay circuit 55 electrically connects the step motor driver 54 to the step motor 56. As shown in FIG. 4, a typically 24-volt, DC motor voltage source 97 is electrically connected to the relay circuit 55 through relay wiring 98 for powering the stepper motor 56 through the relay circuit 55. Accordingly, the relay circuit 55 normally is maintained in a closed configuration to facilitate flow of electrical power from the motor voltage source 97 to the step motor 56 to power the step motor 56 responsive to input by the step motor driver 54, as hereinafter described. A lead screw 60 is coupled to the drive shaft 58 of the step motor 56. A blade collar 62, to which is attached a blade seat 76 that mounts a typically stainless steel robot blade 64, threadibly engages the lead screw 60. Clockwise or counterclockwise rotation of the lead screw 60 is effected by the step motor 56, which is actuated by the step motor driver 54. The step motor driver 54 is actuated by the control board 52 through a command signal 72. Accordingly, clockwise or counterclockwise rotation of the lead screw 60 effects normally downward and upward travel of the blade collar 62 and attached blade 64 in the Z-axis direction, first for pickup and then removal, respectively, of individual wafers from a wafer cassette, as hereinafter further described. An encoder disk 68 may be provided on an encoder shaft 66 drivingly engaged by the step motor 56. An encoder 70 that is provided in magnetic proximity to the encoder disk 68 is electrically connected to the control board 52. The encoder 70 monitors rotation of the encoder disk 68 and provides information indicating the number of revolutions of the encoder disk 68, and thus, of the lead screw 60, to the control board 52 via a feedback signal 74. The number of revolutions of the encoder disk 68 indicates the Z-axis position of the robot blade 64 to the control board 52. Responsive to continuous input from the encoder 70, the control board 52 controls further rotation of the lead screw 60, through the step motor driver 54 and the step motor 56, as needed to initiate, sustain or complete transfer of the wafers from the wafer cassette. As further shown in FIG. 6, blade wiring 83 electrically connects the relay circuit 55 to the robot blade 64 typically in the manner hereinafter described.

Figure 5:
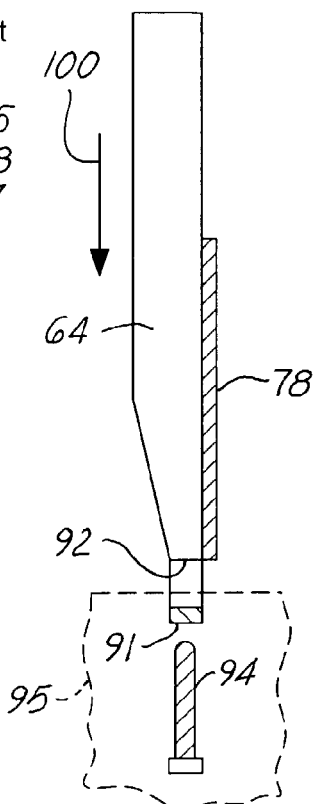
FIG. 5 is a side view of a wafer robot blade, partially in cross-section, in implementation of the present invention, before the blade, improperly positioned with respect to a wafer, contacts the edge of the wafer.
Figure 5A:
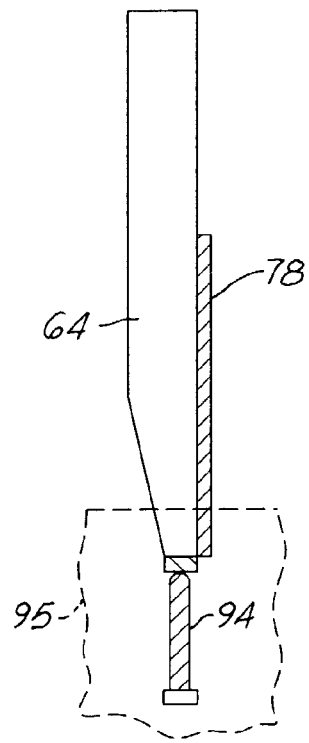
FIG. 5A is a side view of a wafer robot blade, partially in section, in implementation of the present invention, as the blade contacts the edge of the wafer.

As shown in FIGS. 4–5A, the robot blade 64 may be fitted with a rubber or plastic blade gasket 78 having a vacuum opening 80. In use of the robot blade 64 to remove a wafer 94 from a wafer cassette 95, as hereinafter further described, vacuum suction pressure is applied to the vacuum opening 80 through a vacuum tube 82 as the blade gasket 78 contacts the wafer 94 in the wafer cassette 95. The wafer 94 is thus held against the gasket 78 by vacuum pressure as the robot blade 64 lifts the wafer 94 from the cassette 95. The foregoing description of the robot blade 64 is only an example, and it is understood that the wafer protection system of the present invention is applicable to robot blades having a variety of designs and mechanisms for attaching the wafer 94 to the robot blade 64.

As further shown in FIG. 4, the blade wiring 83 includes voltage input wiring 84 that connects a typically 12-volt blade voltage source 88 to the robot blade 64. The voltage input wiring 84 may be attached to the robot blade 64 in electrical contact therewith using a screw 85, as shown, or by any other suitable mechanism for forming electrical contacts known by those skilled in the art. An electrical contact 86 is provided on the blade seat 76, and a return wiring 87 of the blade wiring 83 connects the electrical contact 86 to the relay circuit 55. The relay circuit 55 is electrically connected back to the blade voltage source 88 through wiring (not shown) to complete the circuit components. A foil insulator 90, which may be constructed of rubber, plastic or any other electrically-neutral material suitable for the purpose, covers a first edge of the robot blade 64, from the electrical contact 86 to the bottom edge of the robot blade 64. The foil insulator 90 electrically separates the electrical contact 86 from the robot blade 64. An insulator segment 90a which, like the foil insulator 90 is constructed of an electrically-neutral material, covers a portion of the bottom edge of the robot blade 64 and extends to the second edge of the robot blade 64. A space 92 is defined between the foil insulator 90 and the insulator segment 90a on the bottom edge of the robot blade 64. A flexible conductor foil 91, which is typically constructed of stainless steel or other electrically-conductive metal or material, typically has a thickness of about 0.3 mm and extends along the foil insulator 90 and the insulator segment 90a, spanning the space 92 defined between the foil insulator 90 and the insulator segment 90a. Accordingly, the foil insulator 90 separates and electrically insulates the conductor foil 91 from the blade 64 and normally maintains an open circuit between the relay circuit 55 and the robot blade 64. The conductor foil 91 is provided in electrically-conducive contact with the electrical contact 86. The space 92 between the conductor foil 91 and the bottom edge of the blade 64 is typically about 2 mm.

Figure 5B:
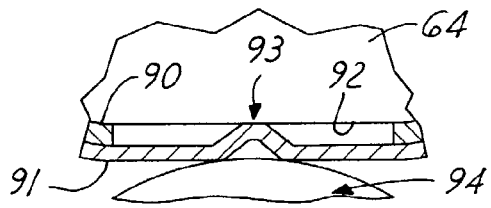
FIG. 5B is a front view of a wafer robot blade in implementation of the present invention, with the conductor foil and foil insulator elements of the invention shown in cross-section, more particularly illustrating electrical contact between the foil conductor and the blade induced by physical contact of the blade with a wafer.

In operation of the robot actuating system 50 in implementation of the present invention, the control board 52 normally sends a command signal 72 to the step motor driver 54, which actuates the step motor 56 to rotate the motor drive shaft 58 and the lead screw 60. Accordingly, depending on the direction of rotation of the lead screw 60 as determined by the control board 52, the robot blade 64 initially moves downwardly in the Z-axis direction toward a wafer 94 preparatory to picking up the wafer 94 and removing the wafer 94 from a wafer cassette 95. Because the relay circuit 55 is normally maintained in a closed position to maintain electrical connection between the motor voltage source 97 (FIG. 4) and the step motor 56, the step motor 56 continues the downward Z-axis movement of the robot blade 64, as indicated by the arrow 100 in FIG. 5 and the arrow 99 in FIG. 6. In the event that the robot blade 64 is misaligned with respect to the wafer 94 during downward movement of the blade 64, as shown in FIG. 5, and the robot blade 64 strikes or contacts the edge of the wafer 94, as shown in FIG. 5A, further downward Z-axis movement of the robot blade 64 is immediately stopped, as follows. The flexible conductor foil 91 initially contacts the edge of the wafer 94 and then bends, deformed by the wafer 94. The deformed conductor foil 91 traverses the space 92 and contacts the robot blade 64 at a contact point 93, as shown in FIG. 5B. At the contact point 93, the conductor foil 91 establishes electrical contact between the robot blade 64, which is electrically connected to the blade voltage source 88 through the voltage input wiring 84, and the electrical contact 86, which is electrically connected to the relay circuit 55 through the return wiring 87. Consequently, electrical current flows from the blade voltage source 88 to the relay circuit 55 through the voltage input wiring 84, the robot blade 64, the conductor foil 91, the electrical contact 86 and the return wiring 87, respectively, and back to the blade voltage source 88. This electrical current causes the normally-closed relay circuit 55 to open, thereby terminating flow of current from the motor voltage source 97, through the relay circuit 55 and to the step motor 56. The step motor 56 therefore terminates further downward Z-axis motion of the robot blade 64 against the edge of the wafer 94. Accordingly, additional and potential wafer-damaging downward pressure of the robot blade 64 against the wafer 94 is avoided. Corrective measures can then be taken to re-adjust the position of the robot blade 64 with respect to the wafer 94 for proper removal of the wafer 94 from the wafer cassette 95. After the relay circuit 55 is re-set, the system is primed to protect additional wafers 94 to be removed from the wafer cassette 95, in the manner heretofore described, as the wafer transfer operation is continued.

While the preferred embodiments of the invention have been described above, it will be recognized and understood that various modifications can be made in the invention and the appended claims are intended to cover all such modifications which may fall within the spirit and scope of the invention.

What is claimed is:

1. A system for protecting a substrate from damage including cracking, chipping and/or abrasion by an inaccurately-positioned robot blade of a transfer robot, comprising:

a conductor foil for mounting on the robot blade in normally electrical isolation with respect to the robot blade;

a relay circuit electrically connected to said conductor foil and normally closed for conducting electrical power to the transfer robot;

a blade voltage source electrically connected to said relay circuit for electrical connection to the robot blade; and wherein said conductor foil contacts the robot blade, said relay opens and electrical power conduction to the transfer robot is broken responsive to contact of the inaccurately-positioned robot blade with an edge of the substrate.

2. The system of claim 1 further comprising a foil insulator for mounting on the robot blade and defining a space between said conductor foil and the robot blade.

3. The system of claim 2 wherein said space is about 2 mm.

4. The system of claim 3 wherein said conductor foil comprises stainless steel.

5. The system of claim 3 wherein said conductor foil has a thickness of about 0.3 mm.

6. The system of claim 5 wherein said conductor foil comprises stainless steel.

7. The system of claim 1 wherein said conductor foil comprises stainless steel.

8. The system of claim 7 further comprising a foil insulator for mounting on the robot blade and defining a space between said conductor foil and the robot blade.

9. The system of claim 1 wherein said conductor foil has a thickness of about 0.3 mm.

10. The system of claim 9 further comprising a foil insulator for mounting on the robot blade and defining a space between said conductor foil and the robot blade.

11. The system of claim 9 wherein said conductor foil comprises stainless steel.

12. The system of claim 11 further comprising a foil insulator for mounting on the robot blade and defining a space between said conductor foil and the robot blade.

13. A system for protecting a substrate from damage including cracking, chipping and/or abrasion by an inaccurately-positioned robot blade of a transfer robot, comprising:

a blade voltage source for electrical connection to the robot blade;

a conductor foil for mounting on the robot blade in normally electrical isolation with respect to the robot blade;

a relay circuit electrically connected to said conductor foil, and said blade voltage source;

a motor voltage source electrically connected to said relay circuit, said relay circuit normally closed for conducting electrical power from said motor voltage source to the transfer robot; and wherein said conductor foil contacts the robot blade, said relay opens and electrical power conduction from said motor voltage source to the transfer robot is broken responsive to contact of the inaccurately-positioned robot blade with an edge of the substrate.

14. The system of claim 13 further comprising a foil insulator for mounting on the robot blade and defining a space between said conductor foil and the robot blade.

15. The system of claim 14 wherein said space is about 2 mm.

16. The system of claim 13 wherein said conductor foil comprises stainless steel.

17. The system of claim 13 wherein said conductor foil has a thickness of about 0.3 mm.

18. A method of protecting a substrate from damage including cracking, chipping and/or abrasion by an inaccurately-positioned robot blade of a transfer robot, comprising the steps of:

providing a conductor foil on the robot blade in normally electrical isolation with respect to the robot blade;

providing a relay circuit in electrical contact with the conductor foil;

causing the robot blade to approach the substrate by providing a first flow of electricity to the transfer robot through said relay circuit; and terminating said first flow of electricity when an edge of the substrate contacts said conductor foil and said conductor foil contacts the inaccurately-positioned robot blade by providing a second flow of electricity through the robot blade, said conductor foil and said relay circuit.

19. The method of claim 18 wherein said conductor foil has a thickness of about 0.3 mm.

20. The method of claim 18 wherein said conductor foil comprises stainless steel.

* * * * *